(12) United States Patent
Kim et al.

(10) Patent No.: US 11,202,385 B2
(45) Date of Patent: Dec. 14, 2021

(54) ELECTRONIC DEVICE INCLUDING PHYSICAL BUTTON STRUCTURE

(71) Applicant: Samsung Electronics Co., Ltd., Suwon-si (KR)

(72) Inventors: Gidae Kim, Suwon-si (KR); Moohyun Baek, Suwon-si (KR); Minwoo Yoo, Suwon-si (KR); Minsung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 17 days.

(21) Appl. No.: 16/664,541

(22) Filed: Oct. 25, 2019

(65) Prior Publication Data

US 2020/0137911 A1    Apr. 30, 2020

(30) Foreign Application Priority Data

Oct. 25, 2018    (KR) ........................ 10-2018-0128064

(51) Int. Cl.
*H05K 5/06*    (2006.01)
*H01H 13/06*    (2006.01)
(Continued)

(52) U.S. Cl.
CPC ......... *H05K 5/069* (2013.01); *G06K 9/00013* (2013.01); *H01H 13/06* (2013.01);
(Continued)

(58) Field of Classification Search
CPC ........ H05K 5/069; H05K 1/148; H05K 1/189; H05K 5/0017; H05K 5/0247;
(Continued)

(56) References Cited

U.S. PATENT DOCUMENTS 8,933,354 B2    1/2015 Ohata et al.
9,767,971 B2    9/2017 Hisano
(Continued)

FOREIGN PATENT DOCUMENTS

CN    201237984 Y    5/2009
EP    3340589 A1    6/2018
(Continued)

OTHER PUBLICATIONS

European Search Report dated Feb. 28, 2020 in connection with European Patent Application No. 19 20 5228, 8 pages.
(Continued)

*Primary Examiner* — Rockshana D Chowdhury

(57) ABSTRACT

An electronic device includes a housing, a button hole disposed on a side of the housing, a physical button mounted in the button hole, a support bracket that supports the physical button, and a waterproof bracket that seals, on a side of the housing to which the button hole is adjacent, at least part of a specified area where the physical button and the support bracket are disposed. The waterproof bracket includes a first bracket that makes close contact inside the housing in a direction toward a first surface of the housing and a second bracket that extends from the first bracket while forming a predetermined angle with the first bracket and that makes close contact inside the housing in a direction toward a second surface of the housing that is different from the first surface of the housing.

20 Claims, 12 Drawing Sheets

(51) Int. Cl.
  *H05K 5/00* (2006.01)
  *H05K 1/18* (2006.01)
  *H05K 5/02* (2006.01)
  *H05K 1/14* (2006.01)
  *G06K 9/00* (2006.01)
  *H01H 13/52* (2006.01)

(52) U.S. Cl.
  CPC ............ *H05K 1/148* (2013.01); *H05K 1/189* (2013.01); *H05K 5/0017* (2013.01); *H05K 5/0247* (2013.01); *H01H 13/52* (2013.01); *H05K 2201/10128* (2013.01); *H05K 2201/10151* (2013.01)

(58) Field of Classification Search
  CPC .......... H05K 2201/10128; H05K 2201/10151; G06K 9/00013; H01H 13/06; H01H 13/52; H04M 1/18; H04M 1/236; G06F 1/1656; G06F 1/1658
  See application file for complete search history.

(56) References Cited

U.S. PATENT DOCUMENTS

| | | |
|---|---|---|
| 9,887,724 B2 | 2/2018 | Takahashi et al. |
| 9,953,775 B2 | 4/2018 | Kim et al. |
| 2013/0001055 A1 | 1/2013 | Ohata et al. |
| 2015/0092345 A1 | 4/2015 | Ely |
| 2017/0099742 A1* | 4/2017 | Choi .................. H05K 5/03 |
| 2017/0154742 A1* | 6/2017 | Hisano .............. H01R 12/592 |
| 2018/0218194 A1* | 8/2018 | Lee .................. H04N 1/00307 |
| 2018/0255219 A1* | 9/2018 | Ramaprakash ........ H04N 5/247 |
| 2019/0208043 A1 | 7/2019 | Cha et al. |
| 2019/0295788 A1* | 9/2019 | Park .................. H04M 1/02 |

FOREIGN PATENT DOCUMENTS

| | | |
|---|---|---|
| JP | 6193210 B2 | 9/2017 |
| KR | 10-2015-0026648 A | 3/2015 |
| KR | 10-2018-0050077 A | 5/2018 |
| WO | 2018/043844 A1 | 3/2018 |
| WO | 2018/084374 A1 | 5/2018 |

OTHER PUBLICATIONS

International Search Report dated Jan. 29, 2020 in connection with International Patent Application No. PCT/KR2019/013175, 3 pages.

* cited by examiner

ELECTRONIC DEVICE INCLUDING PHYSICAL BUTTON STRUCTURE

CROSS-REFERENCE TO RELATED APPLICATION(S)

This application is based on and claims priority under 35 U.S.C. § 119 to Korean Patent Application No. 10-2018-0128064, filed on Oct. 25, 2018, in the Korean Intellectual Property Office, the disclosure of which is incorporated by reference herein its entirety.

BACKGROUND

1. Field

The disclosure relates to an electronic device including a physical button structure.

2. Description of Related Art

An electronic device may employ a structure in which various electronic parts are arranged in a housing and a display is disposed on one surface of the housing. The electronic device may include a structure for preventing the electronic parts arranged in the electronic device from being damaged by introduction of moisture or water.

The above information is presented as background information only to assist with an understanding of the disclosure. No determination has been made, and no assertion is made, as to whether any of the above might be applicable as prior art with regard to the disclosure.

SUMMARY

For example, a power key or a volume key corresponding to a side key has a simple key shape exposed to the outside and a small key width, and therefore a large number of flanges are applied to prevent introduction of moisture or water. Meanwhile, in the case where a fingerprint key is provided in a conventional side key shape, the dimension of a flange corresponding to the fingerprint key (including a click key) to provide a water-inflow delay structure for the fingerprint key may be sufficiently large to damage the design or exterior of the fingerprint key, and in the case of maintaining the design of the side surface on which the fingerprint key is disposed, water-inflow delay time becomes shorter due to the limited dimension of the flange, and hence it may be difficult to prevent introduction of moisture or water. In an external assembly key structure, a fingerprint key has to be connected to a PCB through a connecting passage called an FPCB. However, in the case of employing the above-described moisture or water inflow prevention structure, it may be difficult to assemble the fingerprint key from the outside of an electronic device. In addition, after a device assembly process, a verification process has to be additionally performed in view of additional defects in the fingerprint key itself, and due to a high defect rate, a burden of replacing a part may be raised.

Aspects of the disclosure are to address at least the above-mentioned problems and/or disadvantages and to provide at least the advantages described below. Accordingly, an aspect of the disclosure is to provide an electronic device including a physical button structure for preventing introduction of fluid such as moisture or water through an area where a physical button is disposed.

In accordance with an aspect of the disclosure, an electronic device includes a housing, a button hole disposed on a side of the housing, a physical button mounted in the button hole, a support bracket that supports the physical button, and a waterproof bracket that seals, on a side of the housing to which the button hole is adjacent, at least part of a specified area where the physical button and the support bracket are disposed. The waterproof bracket includes a first bracket that makes close contact inside the housing (or that contacts with at least portion of inside part of the housing) in a direction toward a first surface of the housing and a second bracket that extends from the first bracket while forming a predetermined angle with the first bracket and that makes close contact inside the housing in a direction toward a second surface of the housing that is different from the first surface of the housing.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
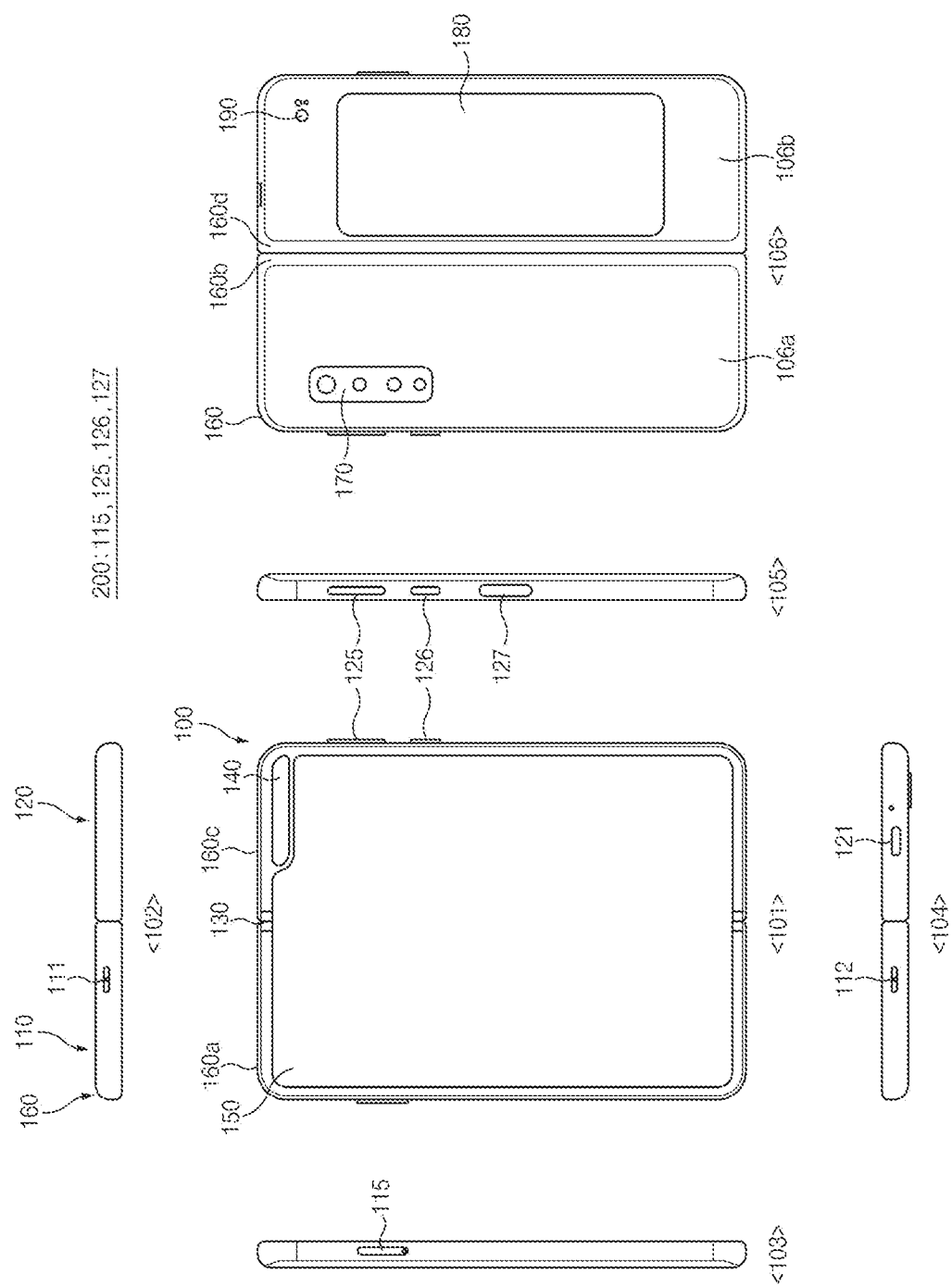
FIG. 1 is a view illustrating the exterior of an electronic device according to various embodiments.

FIGS. 1 through 11B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure. With regard to description of the drawings, similar components may be marked by similar reference numerals.

FIG. 1 is a view illustrating the exterior of an electronic device according to various embodiments.

Referring to FIG. 1, an electronic device 100 according to an embodiment may include a display 150, at least part of a central portion of which is able to be folded at a specified angle or more, and a housing 160 (or, a frame or a case) on which the display 150 is mounted. At least one electronic part (e.g., a battery, a processor, a memory, communication circuitry, or the like) that is associated with driving the display 150 may be disposed inside the housing 160. In FIG. 1, a state 101 illustrates a state in which the display 150 is disposed on a front surface of the unfolded housing 160. A state 102 illustrates an upper side of the electronic device 100, a state 103 illustrates a left side of the electronic device 100 based on the illustrated drawing, a state 104 illustrates a lower side of the electronic device 100 based on the illustrated drawing, a state 105 illustrates a right side of the electronic device 100, and a state 106 illustrates a rear side of the electronic device 100.

The housing 160 may include, for example, a first housing 110, a second housing 120, and a hinge structure 130. The first housing 110 may support a partial area (e.g., a left area) of the display 150 and may be disposed to form a predetermined angle with the second housing 120, with the hinge structure 130 as an axis. The second housing 120 may support another partial area (e.g., a right area) of the display 150 and may be disposed to form the predetermined angle with the first housing 110, with the hinge structure 130 as an axis. For example, the first housing 110 and the second housing 120 may be disposed to form the predetermined angle ranging from 0 degrees to 180 degrees, with the hinge structure 130 as an axis.

The first housing 110 may include a first bezel 160a (or a first peripheral case), a first case 106a, and a second bezel 160b (or a second peripheral case). The first bezel 160a may be disposed on the front surface on which the display 150 is disposed. The first bezel 160a may be disposed to surround at least part of the edge of one side (e.g., a left side based on the illustrated drawing) of the display 150. The first case 106a may be disposed on a rear side of the first housing 110. The second bezel 160b may support the first case 106a on the rear side of the first housing 110. According to various embodiments, the first bezel 160a, the first case 106a, and the second bezel 160b may be integrated into one entity in the first housing 110. The first case 106a may include a hole in which a camera 170 for taking an image of a subject is disposed. In addition to the camera, a biometric sensor for sensing biometric information of a user and a lamp used for light irradiation may be disposed in the hole formed in the first case 106a.

The second housing 120 may include a third bezel 160c (or a third peripheral case), a second case 106b, and a fourth bezel 160d (or a fourth peripheral case). The third bezel 160c may be disposed on the front surface on which the display 150 is disposed. The third bezel 160c may be disposed to surround the edge of an opposite side (e.g., a right side based on the illustrated drawing) of the display 150. The second case 106b may be disposed on a rear side of the second housing 120. The fourth bezel 160d may support the second case 106b on the rear side of the second housing 120. According to various embodiments, the third bezel 160c, the second case 106b, and the fourth bezel 160d may be integrated into one entity in the second housing 120. The second case 106b may include an opening area in which an auxiliary display 180 smaller than the display 150 is disposed. Furthermore, a sensor 190 may be disposed on a side of the second case 106b. The sensor 190 may include at least one of, for example, an illuminance sensor, an iris sensor, and a proximity sensor.

A front camera 140 may be disposed on a side of the display 150 disposed on the front surface. For example, the front camera 140 may be disposed on an upper right side of the display 150 based on the illustrated drawing. Additionally or alternatively, other sensors, for example, an iris sensor, a proximity sensor, and an illuminance sensor may be disposed in the area where the front camera 140 is disposed.

Connectors 111, 112, and 121 including a USB connector or a micro USB connector may be disposed on upper and lower surfaces of the housing 160. Furthermore, an earphone hole for connection of an earphone jack may be disposed on the upper or lower surface of the housing 160.

One or more physical button structures 200 may be disposed on at least one of left and right surfaces of the housing 160. The physical button structures 200 may include a physical button, which may be, for example, a volume button or a power button. According to various embodiments, at least one physical button structure 115, 125, 126, or 127 among the physical button structures 200 may include a fingerprint sensing button capable of sensing a fingerprint. For example, the first physical button structure 115 may be a button capable of sensing a fingerprint, or the second physical button structure 127 may be a button capable of sensing a fingerprint. The physical button structures 200 capable of sensing a fingerprint may be configured to further include other input functions (e.g., a power button function, a volume adjustment function, a camera shutter function, a pressure detection function, and the like), as well as the fingerprint sensing function.

Figure 2:
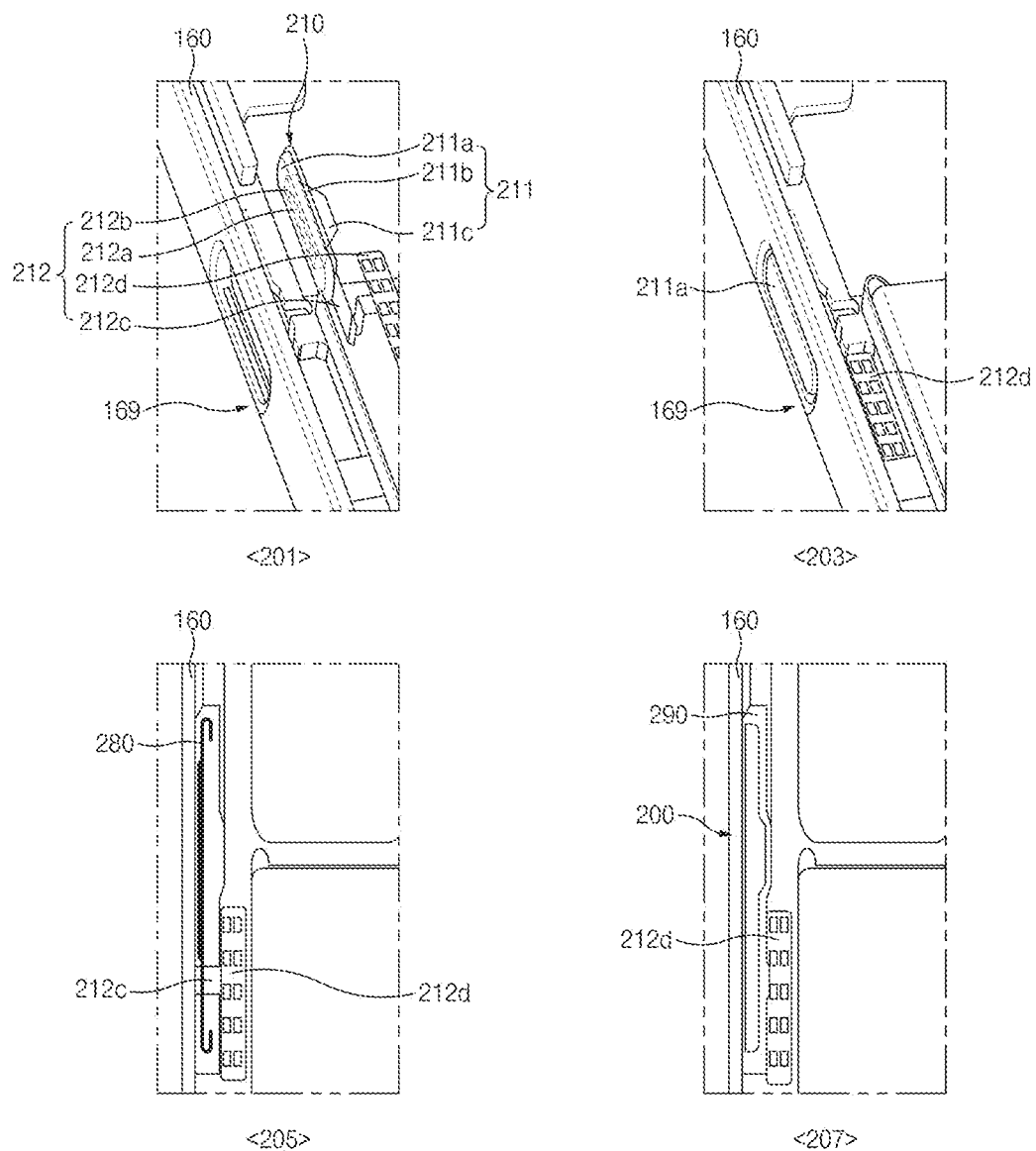
FIG. 2 is a view illustrating an example of an area where a physical button is disposed in the structure of the electronic device according to various embodiments.

FIG. 2 is a view illustrating an example of an area where a physical button is disposed in the structure of the electronic device according to various embodiments.

Referring to FIG. 2, a state 201 illustrates a state in which a button hole 169 formed on a side of the housing 160 and a physical button module 210 mounted in the button hole 169 are separated from each other.

The button hole 169 may be formed through a sidewall of the housing 160. The button hole 169 may have a size and a shape that correspond to a portion of the physical button module 210, such that the physical button module 210 is mounted in the button hole 169. For example, the button hole 169 may be formed in an elliptical shape or in a rectangular shape with rounded corners.

The physical button structures 200 may include the physical button module 210, a support bracket 280, and a waterproof bracket 290.

The physical button module 210 may include a physical button 211 and a fingerprint sensor module 212. The physical button 211 may include a contact portion 211a, a support portion 211b, and a dome key 211c. The contact portion 211a and the support portion 211b may be formed in a stepped shape. At least part of the contact portion 211a may be exposed to the outside through the button hole 169 such that an external object is brought into contact with the contact portion 211a. The support portion 211b may support the physical button module 210 to prevent the physical button module 210 from being separated from the housing 160. The contact portion 211a may be formed in a shape similar to that of the button hole 169, or may be formed to be smaller than the button hole 169. The contact portion 211a may be mounted in the button hole 169. The support portion 211b may be disposed at an end of the contact portion 211a, and at least part of the support portion 211b may be formed to be larger than the size of the button hole 169. The support portion 211b may serve to support the physical button module 210 to prevent the physical button module 210 from being separated from the button hole 169 to the outside. The contact portion 211a may further protrude beyond the support portion 211b, and therefore the physical button module 210 may have a cross-section in a hat shape. The dome key 211c may be disposed on a rear surface of the support portion 211b and may be restored after deformed by a push of the physical button 211. The dome key 211c may include, for example, contact points spaced apart from each other by a predetermined gap. When two contact points are brought into contact with each other by a push of the physical button 211, the dome key 211c may transmit a corresponding signal to a specified part (e.g., sensor circuitry 212d). At least part of the contact portion 211a may be formed to be transparent such that a sensor disposed in the physical button 211 senses a fingerprint, or may be formed of a material through which at least part of light emitted by the sensor to sense a fingerprint passes.

The fingerprint sensor module 212 may include a sensor 212a, a sensor substrate 212b, wiring or an FPCB 212c, and the sensor circuitry 212d. At least part of the sensor 212a may be disposed in the contact portion 211a or the support portion 211b. The sensor substrate 212b may be electrically connected to the sensor 212a. The wiring or the FPCB 212c may be electrically connected with the sensor substrate 212b. The sensor circuitry 212d may be electrically connected with the FPCB 212c and may control fingerprint sensing through the sensor 212a and the sensor substrate 212b. The sensor 212a, the sensor substrate 212b, and at least part of the FPCB 212c may be disposed in an area inside the housing 160 that is adjacent to the button hole 169 (e.g., an area sealed by the waterproof bracket 290). The sensor circuitry 212d may be disposed in a specified area inside the housing 160 that is disposed (or located) outside the area sealed by the waterproof bracket 290.

A state 203 illustrates a state in which the physical button module 210 is inserted into the button hole 169 formed on a side of the housing 160. The contact portion 211a of the physical button module 210 may be mounted in the button hole 169, and the support portion 211b may be disposed inside the housing 160. The sensor circuitry 212d of the physical button module 210 may be fixedly mounted on a mounting area formed on a side of the housing 160 and may be electrically connected with the sensor 212a, which is disposed inside the contact portion 211a, and the sensor substrate 212b through the FPCB 212c.

A state 205 illustrates a state in which the support bracket 280 supporting the physical button module 210 is disposed. The support bracket 280 may support the physical button module 210. The support bracket 280 may have elasticity such that the support bracket 280 deforms while the physical button module 210 is pressed by external pressure and thereafter returns to locate the physical button module 210 at the original position. The support bracket 280 may be disposed, for example, behind the physical button module 210, and at least part of the support bracket 280 may be fixed to the housing 160. The support bracket 280 may have a predetermined length along the sidewall of the housing 160. Opposite edges of the support bracket 280 may be formed in a bent shape such that the opposite edges have a predetermined elasticity while being fixed to the bottom of the housing 160. A central portion of the support bracket 280 may apply elastic force to support the physical button module 210 and bring the physical button module 210 into close contact with the button hole 169. For example, a support member 281 may be disposed on a side of the support bracket 280. The support member 281 may be disposed on a rear surface of the dome key 211c and may serve as a shock absorber to prevent damage to the dome key 211c while the dome key 211c is deformed by a push. The support member 281 may be formed as a component of the support bracket 280, or may be removed according to a design change.

A state 207 illustrates a state in which the button hole 169, at least part of the physical button module 210, and the waterproof bracket 290 covering the support bracket 280 are disposed to have a waterproof function. The waterproof bracket 290 may be formed to have a predetermined length along the sidewall of the housing 160. The waterproof bracket 290 may be formed in the shape of "L" so as to be brought into close contact with an angled corner of the housing 160 (e.g., a corner having an angle formed by the bottom and the sidewall of the housing 160). For example, the waterproof bracket 290 may include a sidewall bracket portion brought into close contact with a first surface of the housing 160 (e.g., the sidewall surface of the housing 160) and a bottom bracket portion brought into close contact with a second surface of the housing 160 (e.g., the bottom of the housing 160). An adhesive member for blocking inflow of fluid may be disposed at the edge of the waterproof bracket 290. The adhesive member may serve to firmly attach the waterproof bracket 290 to the housing 160. The sensor circuitry 212d connected to the FPCB 212c may be disposed on the bottom of the housing 160 so as to be disposed (or located) outside the position where the waterproof bracket 290 is firmly attached to the housing 160.

As described above, the physical button structure 200 according to an embodiment may be assembled by firstly inserting the physical button module 210 in the direction from the inside of the housing 160 to the outside. At this time, the physical button 211 may be temporarily fixed by a temporary fixing tape outside the housing 160. For example, at least part of the temporary fixing tape may be disposed on the button hole 169 and may temporarily fix the physical button 211 mounted in the button hole 169. Additionally, the temporary fixing tape may be removed after the support bracket 280 inside the housing 160 fixes an inward push of the physical button module 210. The waterproof bracket 290 for waterproofing (or water-inflow delay) may be assembled inside the housing 160. The waterproof bracket 290 may be additionally anchored to one side of the housing 160 by using a hook or a screw other than an adhesive member 291.

The physical button structure 200 may include the fingerprint sensor module 212 disposed therein and may support a click function by a user's push (e.g., a function according to an operation of the dome key 211c included in the physical button 211). In the case where water is introduced from the outside, the physical button structure 200 may support a water-inflow delay function or a waterproof function in a plurality of directions because the waterproof bracket 290 is disposed inside the housing 160 in three dimensions. For example, the waterproof bracket 290 may simultaneously support waterproofing or water-inflow delay for the first surface of the housing 160 in the direction toward the sidewall from the inside of the housing 160 and the second surface of the housing 160 in the direction toward the bottom from the inside of the housing 160.

As described above, the physical button structure 200 of the disclosure may be disposed to simultaneously cover the first surface of the housing 160 and the second surface of the housing 160 that forms an angle with the first surface of the housing 160, thereby supporting a waterproof function for the plurality of surfaces and may disperse the pressure of fluid introduced, thereby providing a more sturdy waterproof (or water-inflow delay) function. The ability of the physical button structure 200 to disperse the fluid pressure may consequently support providing a waterproof function (or a water-inflow delay function) even at higher water pressure. Furthermore, the electronic device 100 may provide a waterproof structure or a water-inflow delay structure using a plurality of surfaces. Thus, the thickness of the electronic device 100 may be implemented to be slimmer, and the inner area that is adjacent to the button hole 169 and in which the physical button structure 200 is disposed may be sufficiently ensured, thereby facilitating mounting various structures (e.g., sensor circuitry or other parts).

Moreover, the sensor 212a and the sensor substrate 212b of the fingerprint sensor module 212 may be disposed in the physical button module 210, and thus the physical button structure 200 may solve the problem that the fingerprint sensor module 212 pours out of the housing 160 through the button hole 169. In addition, a portion where fluid introduced from the outside is delivered to the sensor circuitry 212d through the FPCB 212c may be sealed by using waterproof tapes or dispensing adhesives, and thus the physical button structure 200 of the disclosure may prevent the fluid from spreading to the sensor circuitry 212d.

Figure 3:
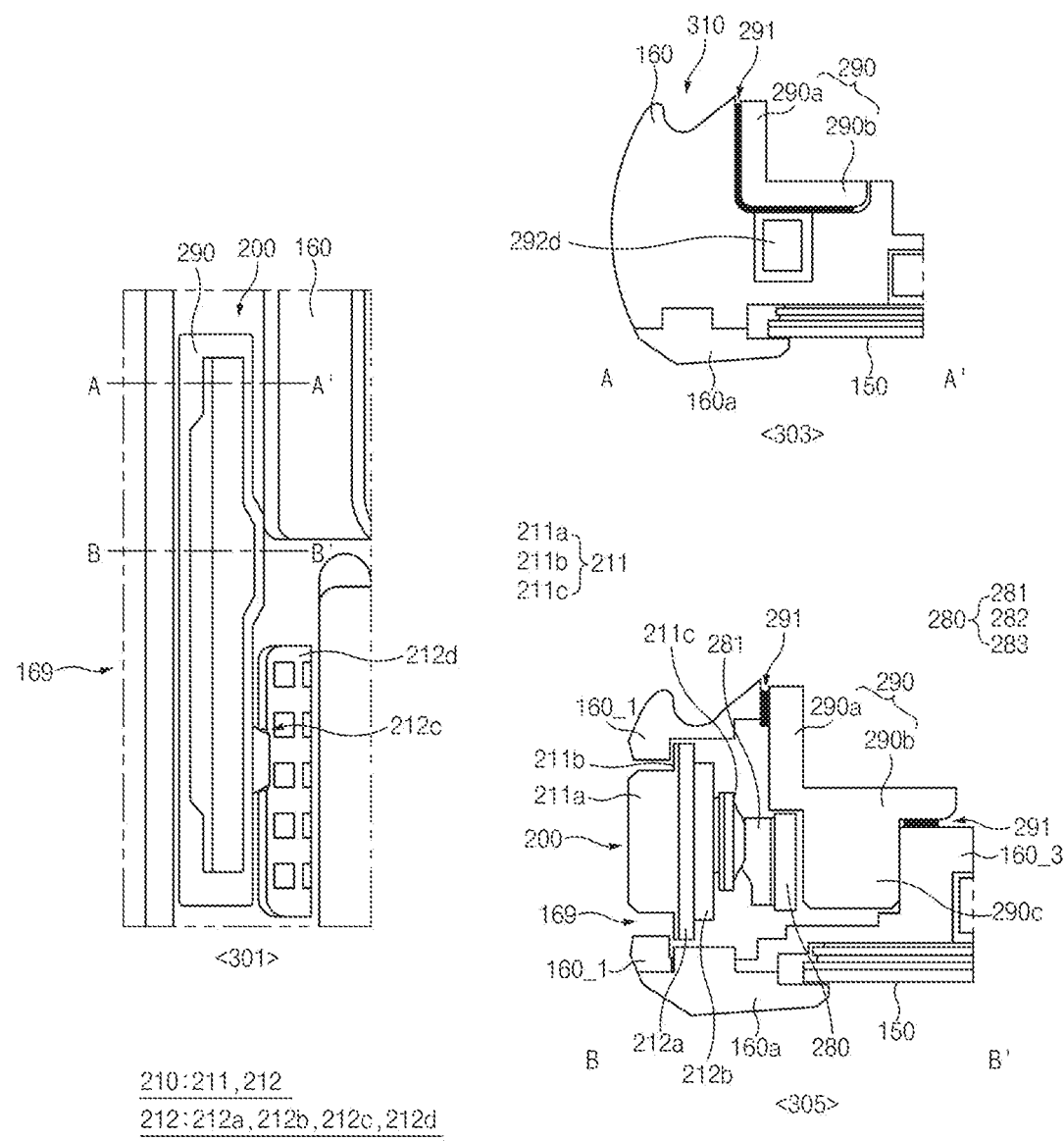
FIG. 3 is a view illustrating an example of a physical button structure of a housing according to various embodiments.

FIG. 3 is a view illustrating an example of the physical button structure of the housing according to various embodiments.

Referring to FIG. 3, a state 301 illustrates a blowup of a partial area of the housing 160 of the electronic device 100, for example, the area of the physical button structure 200. The partial area of the housing 160 may include the area where the button hole 169 and the physical button structure 200 disposed in the button hole 169 are disposed. The state 301 illustrates a state in which the waterproof bracket 290 is disposed to cover the support bracket 280, with the physical button structure 200 mounted in the button hole 169. A state 303 illustrates a cross-section taken along line A-A' in the state 301, and a state 305 illustrates a cross-section taken along line B-B'.

Referring to the state 303, the first bezel 160a may be disposed on a side of the housing 160 (e.g., the front surface on which the display 150 is disposed) and may be disposed to surround at least part of the edge of the display 150, and the waterproof bracket 290 may be attached to the edge of the inside of the housing 160 through the adhesive member 291. The waterproof bracket 290 may have a cross-section in the shape of "L". The waterproof bracket 290 may include a first bracket 290a disposed parallel to the sidewall of the housing 160 and a second bracket 290b disposed on the bottom of the housing 160 while forming a predetermined angle with the first bracket 290a. In the illustrated drawing, the angle formed by the first bracket 290a and the second bracket 290b is illustrated as being 90 degrees or an angle close thereto. However, the disclosure is not limited thereto. That is, the angle between the first bracket 290a and the second bracket 290b may be smaller or larger than 90 degrees (e.g., in the range of 30 degrees to 150 degrees). The edge of the inside of the housing 160 may be formed in a stepped shape lower than the surrounding area by a predetermined depth such that the waterproof bracket 290 is mounted on the edge of the inside of the housing 160. According to an embodiment, the waterproof bracket 290 may serve to support the support bracket 280 and the physical button module 210 to prevent the support bracket 280 and the physical button module 210 from escaping from an area adjacent to the button hole 169 of the housing 160 to the outside.

A rail groove 310 concavely formed such that a rear glass or film is disposed therein may be formed on a side of the rear surface of the housing 160 (e.g., the opposite surface to the front surface on which the display 150 is disposed, that is, the upper surface when viewed based on the illustrated drawing). At least part of the edge of the rear glass may be disposed in the rail groove 310. An adhesive member may be additionally disposed in at least a partial area inside the rail groove 310 to fix the rear glass.

The adhesive member 291 may be disposed between the waterproof bracket 290 and the edge of the inside of the housing 160 (or in a mounting area inside the housing 160). The adhesive member 291 may be formed to be similar to the shape of the waterproof bracket 290 or to be smaller than the waterproof bracket 290. The adhesive member 291 may be formed in a shape corresponding to the shape of the inside of the waterproof bracket 290. For example, a cushion for preventing water inflow or a waterproof tape may be used as the adhesive member 291, and therefore the thickness of the adhesive member 291 and the area where the adhesive member 291 is disposed may be adjusted in various ways. The adhesive member 291 may be disposed below the waterproof bracket 290 and may form a closed curve to seal a lower area of the waterproof bracket 290.

Referring to the state 305, the button hole 169 may be formed in the housing 160, and the housing 160 may include a hole bezel 160_1 disposed to surround the button hole 169.

The hole bezel 160_1 may include a portion of the housing 160 disposed in the direction in which the rear glass is disposed and a portion of the housing 160 disposed in the direction in which the display 150 is disposed. At least part of the first bezel 160*a* may be mounted on the hole bezel 160_1. At least part of the contact portion 211*a* of the physical button structure 200 may be exposed to the outside through the button hole 169, and at least part of the support portion 211*b* connected with the contact portion 211*a* may be mounted inside the housing 160 in which the button hole 169 is formed. The fingerprint sensor module 212 may be disposed in the support portion 211*b* (or in the support portion including at least a partial area of the contact portion 211*a*).

The fingerprint sensor module 212 may include the sensor 212*a*, the sensor substrate 212*b*, the FPCB 212*c*, and the sensor circuitry 212*d*. The sensor 212*a* may transmit and receive signals for sensing a fingerprint. The sensor substrate 212*b* may support the sensor 212*a* and may be electrically connected with the sensor 212*a*. The sensor substrate 212*b* may be connected with the wiring or the FPCB 212*c*. The FPCB 212*c* may be electrically connected with the sensor circuitry 212*d*. According to an embodiment, one side of the FPCB 212*c* may be disposed on one side of the dome key 211*c*. The dome key 211*c* may be electrically connected with the sensor substrate 212*b*. Accordingly, the FPCB 212*c* may be connected to the dome key 211*c* while being connected to the sensor substrate 212*b* through the dome key 211*c* and may transfer, to the sensor circuitry 212*d*, signals according to operations of the sensor 212*a* and the dome key 211*c*. The dome key 211*c* may be disposed behind the fingerprint sensor module 212, and the support member 281 supporting the dome key 211*c* may be disposed behind the dome key 211*c*. The support member 281 may be formed of plastic or rubber, or a combination thereof. The support member 281 may be integrally formed on a side of the support bracket 280, or may be integrally formed on the rear surface of the dome key 211*c*.

The support bracket 280 may be formed of an elastic material and may be formed of a metal material or a reinforced plastic material having a predetermined rigidity to apply elastic force to the dome key 211*c* through the support member 281. For example, the support bracket 280 may be formed of a SUS material. The support member 281 may be disposed on a side of the support bracket 280, and the support member 281 may be disposed behind the dome key 211*c*.

The waterproof bracket 290 for the area where the button hole 169 is formed may include the first bracket 290*a*, the second bracket 290*b*, and a bracket support 290*c*. The bracket support 290*c* may be connected with the second bracket 290*b* and may be disposed to protrude in the direction of the display 150. The bracket support 290*c* may serve to support the support bracket 280. In this regard, the bracket support 290*c* may support one surface of the support bracket 280. The adhesive member 291 may be disposed between the first bracket 290*a* and the hole bezel 160_1 and between the second bracket 290*b* and a front case 160_3. According to various embodiments, the front case 160_3 may be a component of the housing 160, or may be separated from the housing 160.

Figure 4:
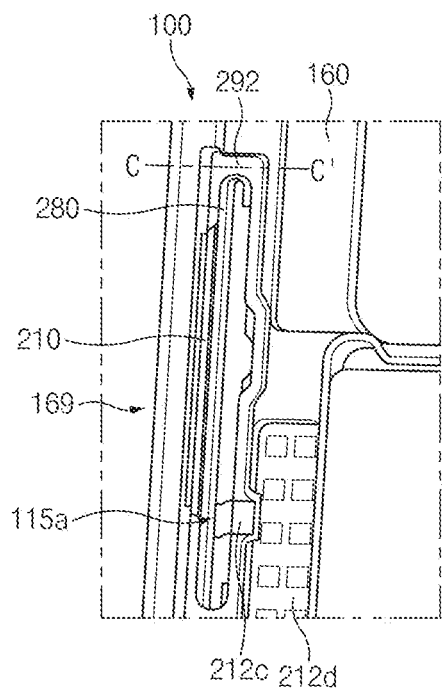
FIG. 4 is a view illustrating a different form of a waterproof bracket according to various embodiments.
Figure 4:
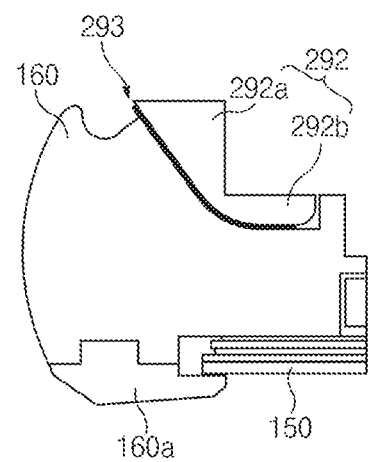
Figure 4:
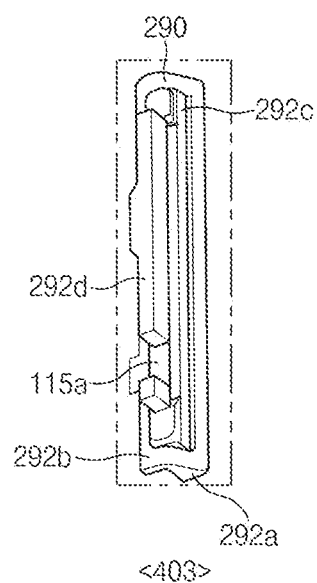
Figure 4:
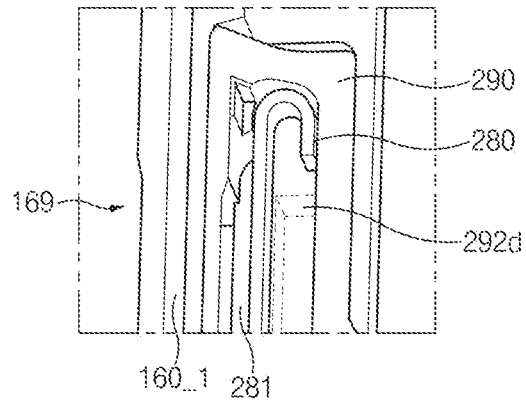

FIG. 4 is a view illustrating a different form of a waterproof bracket according to various embodiments.

Referring to FIG. 4, as in a state 401, the electronic device 100 may include the physical button structure 200 disposed in the position where the button hole 169 is disposed on a side of the housing 160. The physical button structure 200 may include the physical button module 210, the support bracket 280, and a waterproof bracket 292.

A state 403 illustrates the exterior of the waterproof bracket 292, and a state 405 illustrates a cross-section taken along line C-C' in the state 401. Referring to the states 403 and 405, the waterproof bracket 292 may include a first bracket 292*a*, a second bracket 292*b*, a first bracket support 292*c* that are connected with the first bracket 292*a* and the second bracket 292*b* and that protrude by a predetermined height in the direction in which the display 150 is displayed, and a second bracket support 292*d* that is connected to the first bracket support 292*c* and that further protrudes beyond the first bracket support 292*c* in the direction in which the display 150 is disposed.

The inside of the first bracket 292*a* and the inside of the second bracket 292*b* may be formed to be flat. Accordingly, the angle between the inside of the first bracket 292*a* and the inside of the second bracket 292*b* may be a specified angle (e.g., a right angle or a predetermined angle between 40 degrees and 160 degrees). The surface where the outside of the first bracket 292*a* and the outside of the second bracket 292*b* meet may have a specified curvature. In this regard, the edge of the inside of the housing 160 may be formed to have a predetermined curvature. An adhesive member 293 may be disposed between the waterproof bracket 292 and the housing 160. The adhesive member 293 may be disposed along the exterior of the waterproof bracket 292 or the exterior of the housing 160, and at least part of the adhesive member 293 may be disposed to be curved. At least part of the adhesive member 293 may be disposed along the edge of the waterproof bracket 292 to form a closed curve.

The total area of the first bracket support 292*c* may be larger than the total area of the second bracket support 292*d*. The first bracket support 292*c* may include a first area connected with the first bracket 292*a* and having a predetermined height and a second area connected with the second bracket 292*b* and having a predetermined height. The first area and the second area may be connected together while forming a predetermined angle. The second bracket support 292*d* may be formed on the second area corresponding to the second bracket 292*b*. The second bracket support 292*d* may have, on a side thereof, a wiring groove 115*a* in which the wiring or the FPCB 212*c* is disposed. For example, on a side of the second bracket support 292*d*, the wiring groove 115*a* may be concavely formed in a lower position than the surrounding area. For example, the wiring groove 115*a* may have the same height as the bottom of the second area, or may have a height lower than the bottom of the second area. The wiring groove 115*a* may be formed on a side of the second bracket support 292*d* (e.g., on a side of the edge thereof) to prevent the wiring mounted in the wiring groove 115*a* from being separated in a specific direction. The wiring groove 115*a* may have a shape in which portions of the second bracket support 292*d* are disposed as sidewalls on opposite sides of the wiring groove 115*a*. The FPCB 212*c* may be connected to the sensor circuitry 212*d* through the wiring groove 115*a*.

Referring to a state 407, a bent portion at one end of the support bracket 280 may be disposed in a space between the second bracket support 292*d* of the waterproof bracket 292 and a first outer surface of the second bracket 292*b* (e.g., an upper side of the second bracket 292*b* based on the illustrated drawing). Alternatively, the bent portion at the one end of the support bracket 280 may be disposed in a space between the second bracket support 292*d* and the second area formed above the second bracket 292*b*. Similarly, a bent portion at an opposite end of the support bracket 280 may be disposed in a space between the second bracket support 292*d* of the waterproof bracket 292 and a second outer surface of the second bracket 292*b* (e.g., a lower side of the second bracket 292*b*). Alternatively, the bent portion at the opposite end of the support bracket 280 may be disposed in a space between the second bracket support 292*d* and the second area formed below the second bracket 292*b*.

Figure 5:
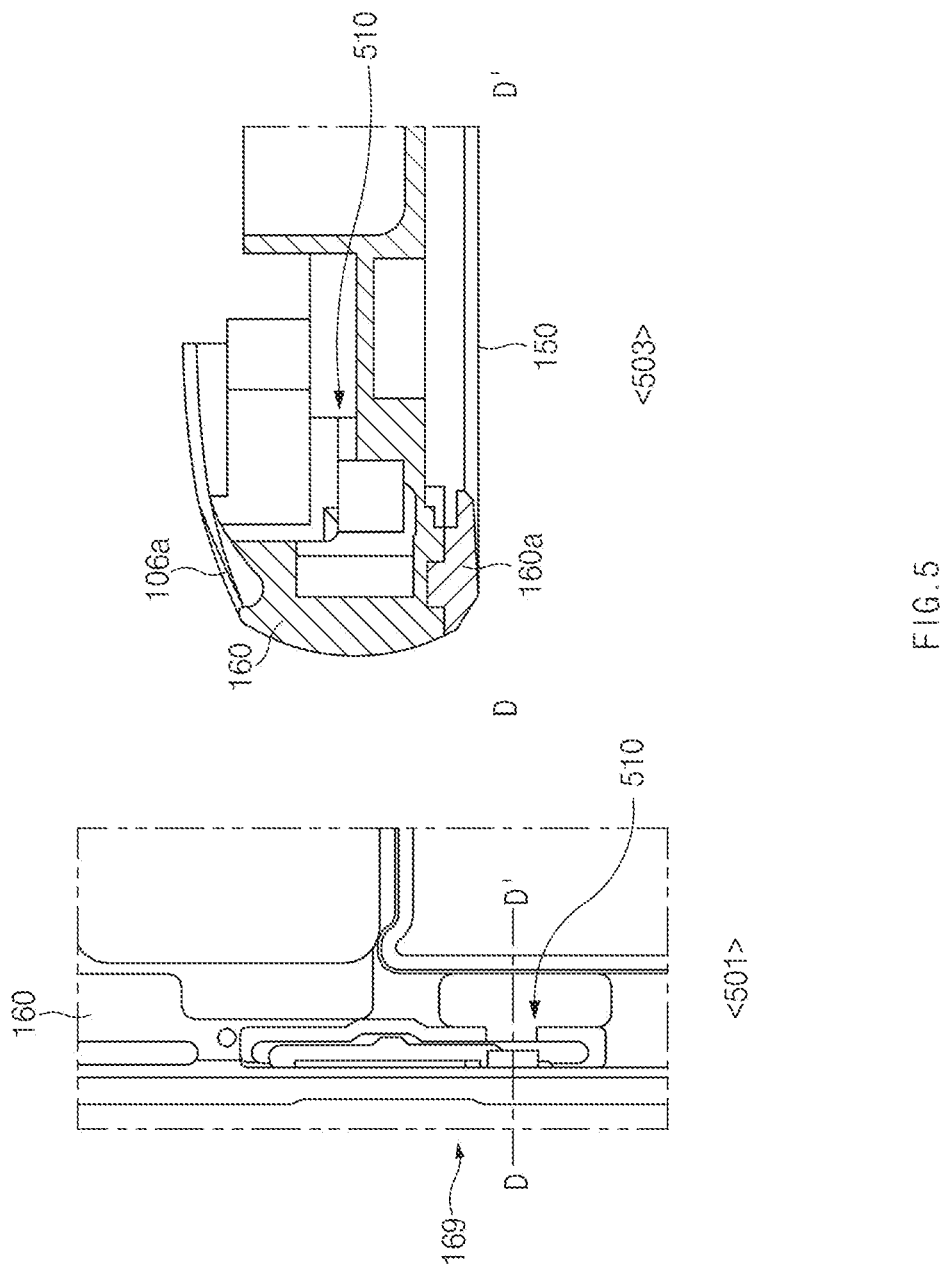
FIG. 5 is a view illustrating an example of an area where the physical button structure is disposed in the housing of the electronic device according to various embodiments.

FIG. 5 is a view illustrating an example of an area where the physical button structure is disposed in the housing of the electronic device according to various embodiments.

Referring to FIG. 5, as in a state 501, the button hole 169 may be disposed on a side of the housing 160 of the electronic device 100. The button hole 169 may be formed through the sidewall of the housing 160. The edge of one side of the housing 160 where the button hole 169 is disposed may be formed with a step, thereby improving contact of the physical button structure 200. For example, in the case where the physical button structure 200 further protrudes to the outside beyond the surface of the entrance of the button hole 169, the physical button structure 200 may easily collide with external pressure or an external object. In this case, impact may be applied to a fingerprint sensor included in the physical button structure 200, and therefore the physical button structure 200 may be disposed in the button hole 169 such that the surface of the contact portion 211*a* is disposed inward of the surrounding area of the button hole 169. The surrounding area of the button hole 169 may be formed with a step, thereby improving contact of a user's finger with the contact portion 211*a*.

A state 503 illustrates a cross-section taken along line D-D' in the state 501. As illustrated, one side wall but not a separate hole bezel in the housing 160 may be observed by cutting the sidewall of the housing 160 outside the area where the button hole 169 is formed. The first bezel 160*a* may be disposed on a side of the housing 160 (e.g., one side in the direction in which the display 150 is disposed). As mentioned above, the first bezel 160*a* may be disposed to surround the edge of the display 150 or to cover at least part thereof.

Figure 6:
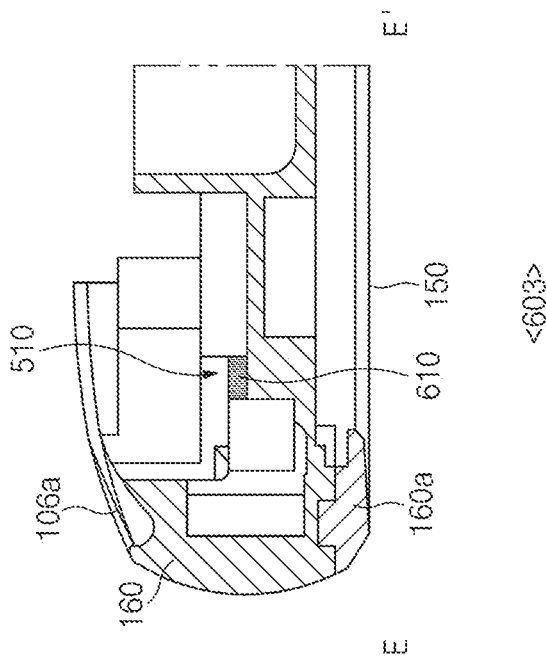
FIG. 6 is a view illustrating an example of a partial area of the housing where the physical button structure is disposed according to various embodiments.
Figure 6:
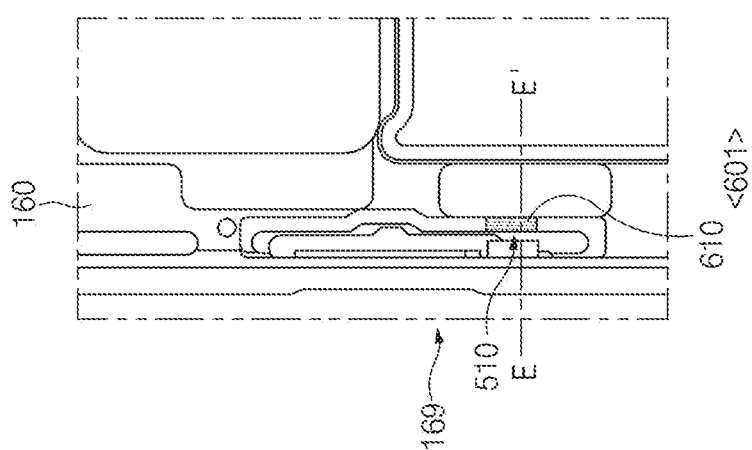

FIG. 6 is a view illustrating an example of a partial area of the housing where the physical button structure is disposed according to various embodiments.

Referring to FIG. 6, as in a state 601, the button hole 169 may be formed in a sidewall of the housing 160, and the bottom of the housing 160 that is adjacent to the button hole 169 may be concavely formed in a lower position than the surrounding area such that a physical button structure is disposed therein. Additionally, the housing 160 may have, in a partial area therein, a bottom groove 510 that is concavely formed in a lower position than the adjacent surrounding area and in which wiring of the physical button structure disposed in the button hole 169 is disposed. An adhesive member, for example, a first waterproof tape 610 may be disposed on at least one side of the bottom groove 510.

A state 603 illustrates a cross-section taken along line E-E' in the state 601. The cross-section taken along line E-E' may be a cross-section obtained by cutting a neighboring sidewall rather than the sidewall in which the button hole 169 is formed. Alternatively, the cross-section taken along line E-E' may be a cross-section obtained by cutting an area including the bottom groove 510 in which sensor circuitry and wiring are disposed. The first waterproof tape 610 may be disposed in the bottom groove 510. The height of the first waterproof tape 610 mounted on the bottom groove 510 may be lower than that of the surrounding area of the bottom groove 510, on which the first waterproof tape 610 is mounted, such that when the wiring or the FPCB 212*c* is placed on the first waterproof tape 610, the height of the corresponding position does not protrude.

Figure 7:
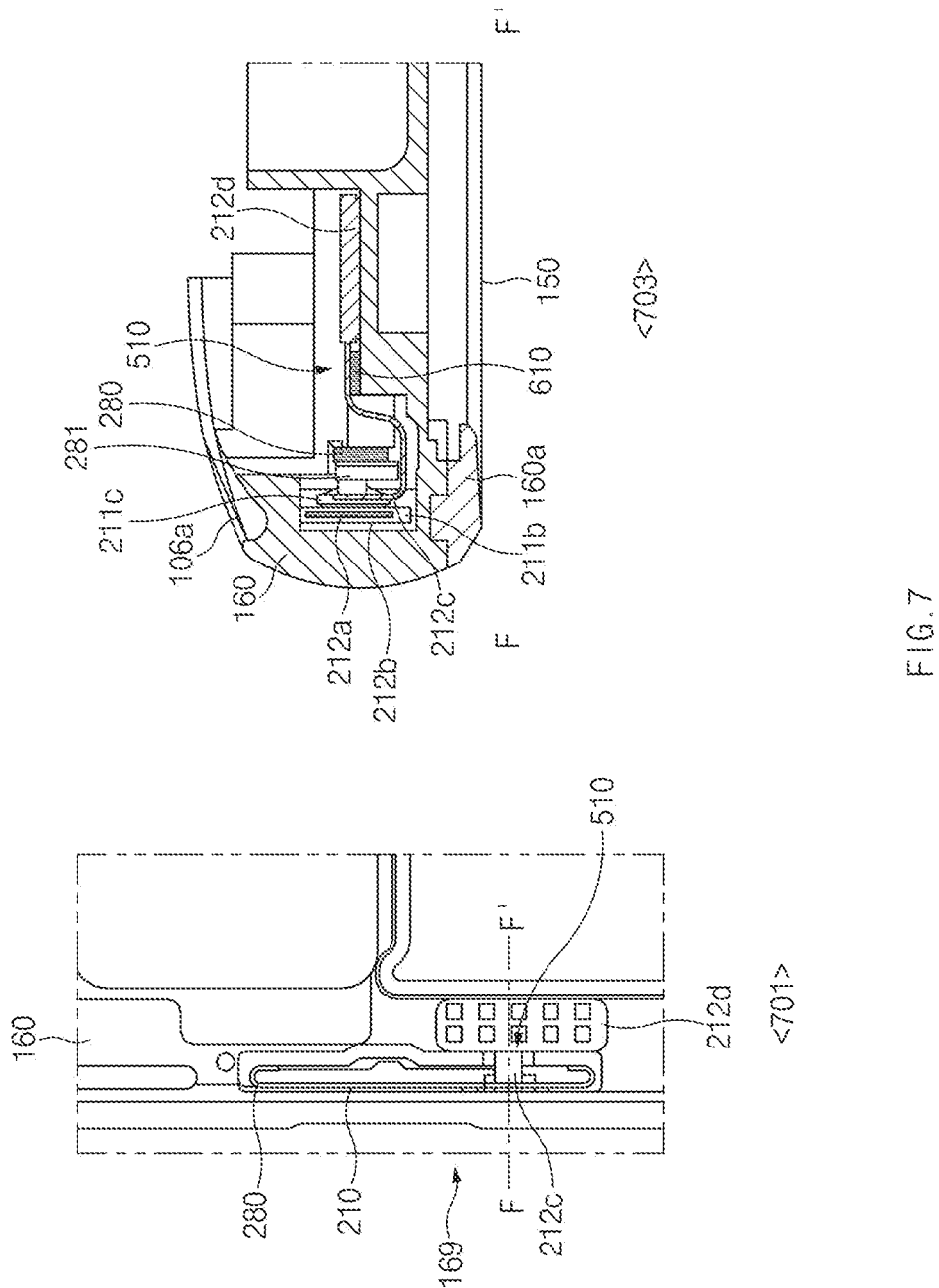
FIG. 7 is a view illustrating an example of an area where part of the physical button structure is disposed in the housing of the electronic device according to various embodiments.

FIG. 7 is a view illustrating an example of an area where part of the physical button structure is disposed in the housing of the electronic device according to various embodiments.

Referring to FIG. 7, a state 701 illustrates a partial area of the housing 160 where the button hole 169 is disposed, and a state 703 illustrates a cross-section taken along line F-F' in the state 701.

Referring to the states 710 and 703, the button hole 169 may be disposed in the partial area of the housing 160. At least part of the physical button structure may be disposed in the interior of the housing 160 that is adjacent to the button hole 169. The sensor 212*a* and at least part of the sensor substrate 212*b* that are included in the fingerprint sensor module 212 of the physical button module 210 may be disposed in at least one of the support portion 211*b* and the contact portion 211*a*. The physical button module 210 and the support bracket 280 supporting the rear surface of the physical button module 210 may be disposed in the partial area of the housing 160. The dome key 211*c*, at least part of which is brought into contact with the rear surface of the support portion 211*b* on which the sensor substrate 212*b* is mounted, may be disposed in the partial area of the housing 160. The support member 281, at least part of which is brought into contact with the dome key 211*c*, may be disposed behind the dome key 211*c*. At least part of the support member 281 may be formed as a portion of the support bracket 280 or may be formed to be independent of the support bracket 280 and may be disposed between the dome key 211*c* and the support bracket 280.

One side of the FPCB 212*c* may be connected to the sensor substrate 212*b*, and an opposite side of the FPCB 212*c* may be connected to the sensor circuitry 212*d*. The FPCB 212*c* may be disposed in the bottom groove 510 described above with reference to FIG. 6. At this time, the bottom of the FPCB 212*c* may be brought into contact with the upper surface of the first waterproof tape 610 placed on the bottom of the bottom groove 510. The first waterproof tape 610 may serve to prevent fluid introduced into the area where the physical button structure is disposed from spreading into the interior of the housing 160 (e.g., the area where the sensor circuitry 212*d* is disposed) with respect to the portion brought into contact with the FPCB 212*c*.

Figure 8:
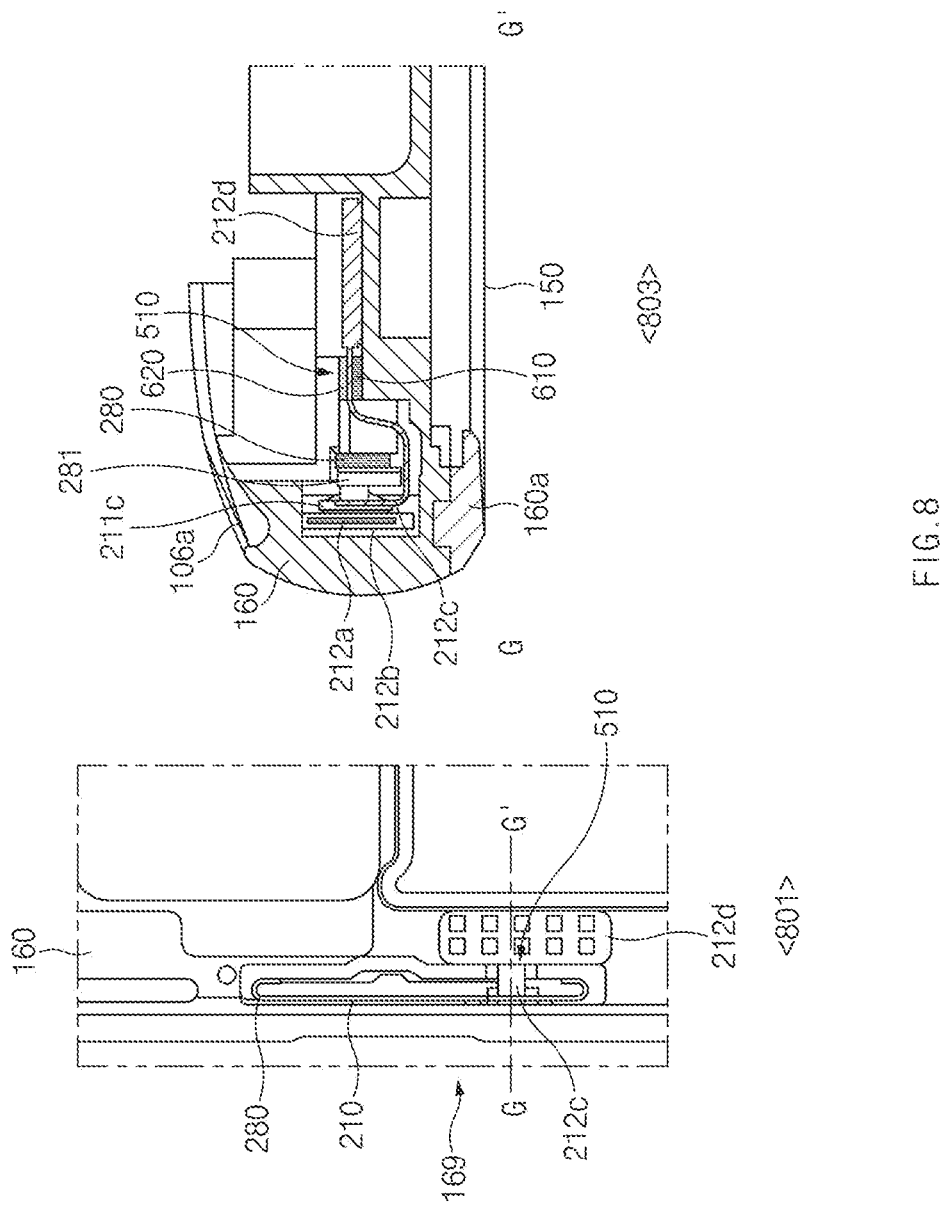
FIG. 8 is a view illustrating another example of an area where part of the physical button structure is disposed in the housing of the electronic device according to various embodiments.

FIG. 8 is a view illustrating another example of an area where part of the physical button structure is disposed in the housing of the electronic device according to various embodiments.

Referring to FIG. 8, a state 801 illustrates a shape in which the support bracket 280 is disposed in the area where the button hole 169 of the housing 160 is disposed and the FPCB 212*c* is disposed in the bottom groove 510. A state 803 illustrates a cross-section taken along line G-G' in the state 801.

As in the states 801 and 803, a physical button module (e.g., the support portion 211*b*, the sensor 212*a* and the sensor substrate 212*b* mounted in the support portion 211*b*, the FPCB 212*c*, the sensor circuitry 212*d*, and the dome key 211*c* disposed on the rear surface of the support portion 211*b*) may be mounted in the button hole 169 formed in a partial area of the housing 160. The support member 281 may be formed on a side of the support bracket 280 and may be disposed behind the dome key 211*c* to face at least part of the dome key 211*c*. The support member 281 may be formed as a partial structure of the support bracket 280 or may be formed to be independent of the support bracket 280 and may be disposed between the support bracket 280 and the dome key 211c. The FPCB 212c may be disposed to be electrically connected with the sensor circuitry 212d through the bottom groove 510 in which the first waterproof tape 610 is disposed.

In the above-described structure, a second waterproof tape 620 may be disposed on a partial area of the FPCB 212c. Accordingly, in the bottom groove 510, the first waterproof tape 610 and the second waterproof tape 620 may be disposed in a sandwich shape in which a portion of the FPCB 212c is sandwiched between the first waterproof tape 610 and the second waterproof tape 620. According to various embodiments, the second waterproof tape 620 may be replaced by applying a waterproof dispensing adhesive.

Figure 9:
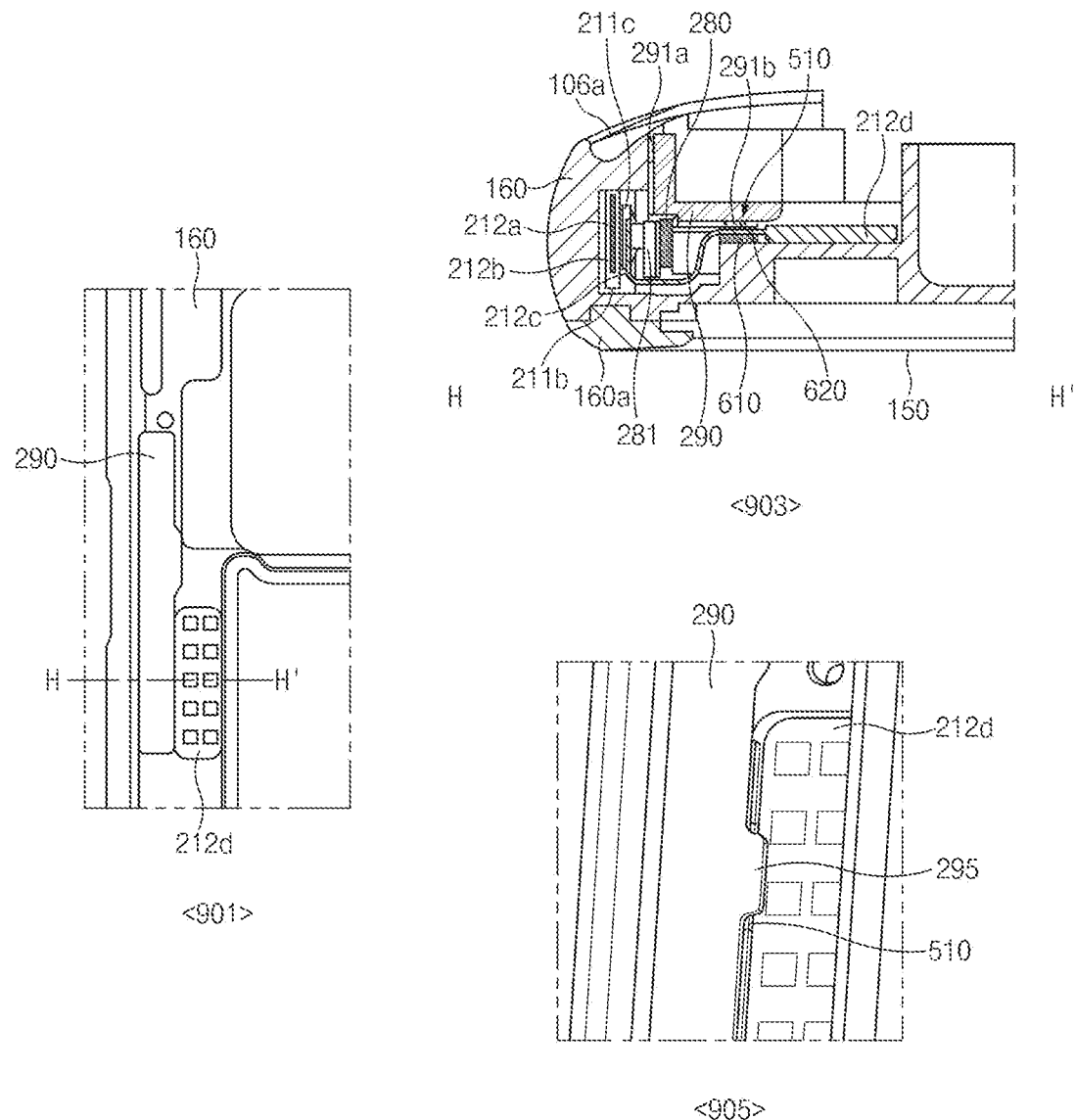
FIG. 9 is a view illustrating an example of an area where the physical button structure is disposed in the housing of the electronic device according to various embodiments.

FIG. 9 is a view illustrating an example of an area where the physical button structure is disposed in the housing of the electronic device according to various embodiments.

Referring to FIG. 9, a state 901 illustrates a state in which the waterproof bracket 290 is disposed to cover at least part of the physical button module 210 and the support bracket 280. A state 903 illustrates a cross-section taken along line H-H' in the state 901. A state 905 illustrates a blowup of an area where the waterproof bracket 290 and the sensor circuitry 212d are adjacent to each other.

Referring to the states 901, 903, and 905, the physical button module 210 and the support bracket 280, which have been described above with reference to FIGS. 5, 6, and 7, may be disposed inside the housing 160 having the button hole 169 formed therein, and the waterproof bracket 290 may be disposed to cover at least part of the physical button module 210 and the support bracket 280. The waterproof bracket 290 may be disposed to cover the support portion 211b of the physical button module 210, the sensor 212a disposed in the support portion 211b, the sensor substrate 212b, and at least part of the FPCB 212c.

As illustrated, the waterproof bracket 290 may include the first bracket 290a and the second bracket 290b. The first bracket 290a may be brought into close contact with one side of the housing 160 through a first adhesive member 291a, and the second bracket 290b may be brought into close contact with an opposite side (or a front case) of the housing 160 through a second adhesive member 291b. At this time, at least part of the second adhesive member 291b may be disposed between a specified area of the second bracket 290b and the second waterproof tape 620 and may block the front and rear sides of the bottom groove 510, in which the FPCB 212c is disposed, to provide a waterproof effect.

The waterproof bracket 290 may include a protruding area 295 that further protrudes beyond the surrounding area in the direction toward the sensor circuitry 212d to increase the contact area with the second waterproof tape 620 in the area of the bottom groove 510. The second adhesive member 291b may be disposed below the protruding area 295, and the second waterproof tape 620 may be disposed below the second adhesive member 291b. Meanwhile, in the illustrated drawing, the second adhesive member 291b is illustrated as being narrower than the second waterproof tape 620. However, the disclosure is not limited thereto. For example, the width of the second adhesive member 291b placed below the second bracket 290b and above the bottom groove 510 may be similar to the width of the second waterproof tape 620.

Figure 10:
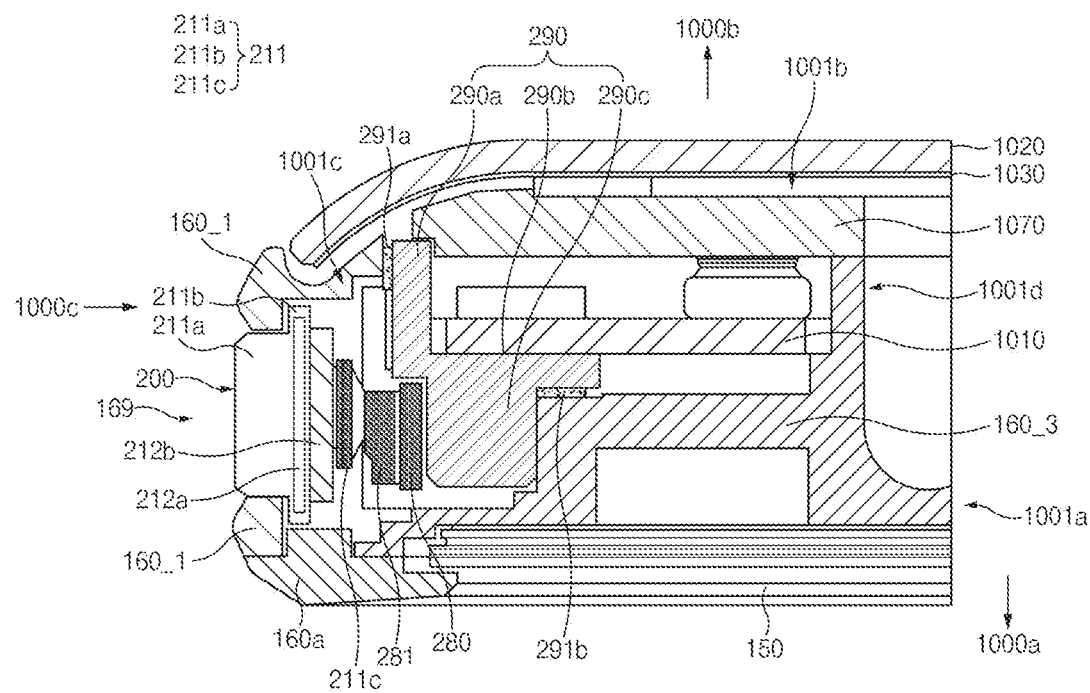
FIG. 10 is a view illustrating cross-sections of an area where the physical button structure is disposed in the housing of the electronic device according to various embodiments.
Figure 10:
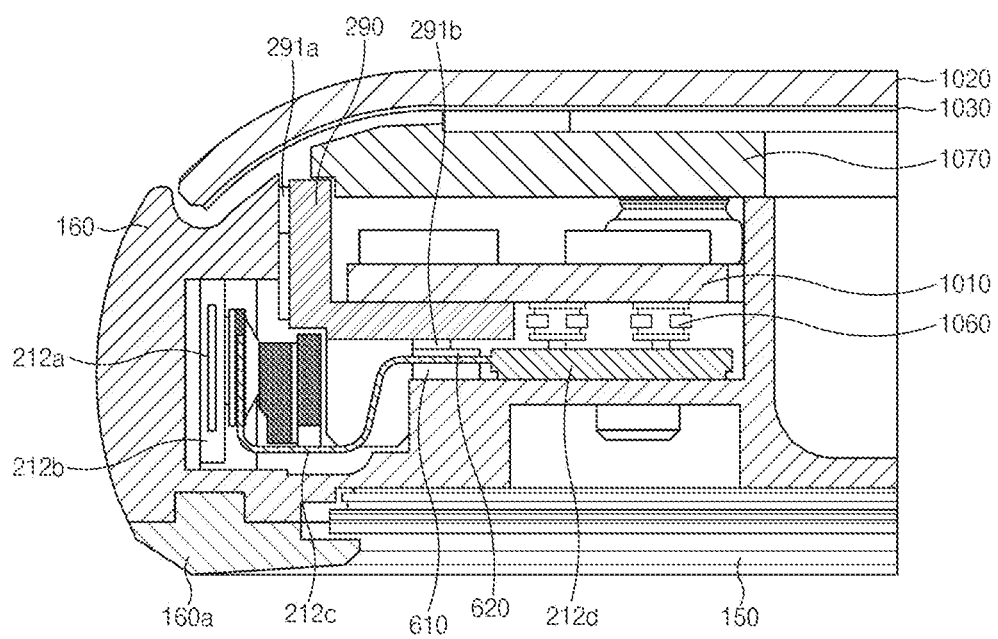

FIG. 10 is a view illustrating cross-sections an area where the physical button structure is disposed in the housing of the electronic device according to various embodiments.

Referring to FIG. 10, a state 1001 illustrates a cross-section from a sidewall of the housing 160 that has the button hole 169 to part of the inside of the housing 160, and a state 1003 illustrates a cross-section from a sidewall of the housing 160 that does not have the button hole 169 to part of the inside of the housing 160 in which the sensor circuitry 212d is disposed.

Referring to the states 1001 and 1003, the electronic device 100 may include the housing 160, the display 150, the front case 160_3, a rear case 1070, a printed circuit board 1010, a back cover 1020, and the physical button structure 200. The housing 160 may have the button hole 169 formed therein, and a part (e.g., the contact portion 211a) of the physical button structure 200 may be exposed to the outside through the button hole 169. The front case 160_3 may be a part of the housing 160, or may be a separate structure separated from the housing 160. Alternatively, the front case 160_3 may be injection-molded inside the housing 160. The rear case 1070 may be a component disposed on a side of the back cover 1020. The rear case 1070 may be a part of the housing 160, or may be disposed to be separated from the housing 160. The back cover 1020 may be placed above the rear case 1070, and a film 1030 may be disposed between the back cover 1020 and the rear case 1070. The film 1030 may have a specified pattern or design, or may have a logo recorded thereon. The back cover 1020 may be at least part of the first case 106a or the second case 106b described above with reference to FIG. 1.

Various electronic parts (e.g., a memory, a processor, and the like) associated with driving the electronic device 100 may be disposed on the printed circuit board 1010. The printed circuit board 1010 may be electrically connected with the sensor circuitry 212d through contact points 1060. The printed circuit board 1010 may receive, from the sensor circuitry 212d, a signal associated with operating at least the dome key 211c. Alternatively, in the case where the sensor circuitry 212d is connected with the sensor 212a and the sensor substrate 212b, the printed circuit board 1010 may transmit/receive a signal associated with fingerprint sensing to/from the sensor circuitry 212d. According to an embodiment, the processor mounted on the printed circuit board 1010 may perform control to activate the sensor 212a when receiving an input signal corresponding to a push from the dome key 211c. Alternatively, the processor mounted on the printed circuit board 1010 may activate the sensor 212a when fingerprint sensing is requested in response to execution of a specific function that is output on the display 150. In this case, even though the separate dome key 211c is not pressed, the processor may perform control to sense a fingerprint when a user's finger is brought into contact with the physical button 210. For example, the processor may perform control to emit light every predetermined period and sense a fingerprint from the user's finger that accesses or makes contact with the physical button 210.

The physical button structure 200 according to an embodiment may include the physical button module 210, the support bracket 280, and the waterproof bracket 290.

The physical button module 210 may include the physical button 211 and the fingerprint sensor module 212. The physical button 211 may include the contact portion 211a, the support portion 211b, and the dome key 211c. According to various embodiments, the support member 281 may be formed as a partial structure of the physical button 211, or may be formed as a partial structure of the support bracket 280.

The fingerprint sensor module 212 may include the sensor 212a, the sensor substrate 212b, the FPCB 212c, and the sensor circuitry 212d. At least part of the sensor 212a and the sensor substrate 212b of the fingerprint sensor module 212 may be mounted on at least a part of the contact portion 211a and the support portion 211b. At least part of the sensor 212a, the sensor substrate 212b, and the FPCB 212c of the fingerprint sensor module 212 may be covered with the waterproof bracket 290 in a predetermined peripheral area of the housing 160 that is adjacent to the button hole 169. Accordingly, the area where the physical button module 210 is disposed may have a waterproof or dustproof function by the waterproof bracket 290. For example, the electronic device 100 may include the adhesive member 291 disposed between the waterproof bracket 290 and the housing 160 and between the waterproof bracket 290 and the front case 160_3. Alternatively, the electronic device 100 may include the first adhesive member 291a disposed between the first bracket 290a of the waterproof bracket 290 and the housing 160. Furthermore, the electronic device 100 may have a waterproof or dustproof function based on the second adhesive member 291b between the second bracket 290b of the waterproof bracket 290 and the second waterproof tape 620. In this regard, the electronic device 100 may have a structure in which the first waterproof tape 610 is disposed in the bottom groove in which the FPCB 212c is disposed, a portion of the FPCB 212c is disposed on the first waterproof tape 610, the second waterproof tape 620 is disposed on the FPCB 212c, the second adhesive member 291b is disposed on the second waterproof tape 620, and the waterproof bracket 290 is disposed on the second adhesive member 291b. Based on at least part of the arrangement structure, the electronic device 100 may prevent the spread of fluid or moisture introduced through the FPCB 212c.

The support bracket 280 may be disposed behind the support member 281 that is aimed at dispersing the pressure generated while the dome key 211c included in the physical button module 210 is pressed, or preventing damage to the dome key 211c.

The waterproof bracket 290 may include the first bracket 290a, the second bracket 290b, and the bracket support 290c. The bracket support 290c may be disposed such that at least part thereof faces the support bracket 280.

According to the various embodiments described above, an electronic device according to an embodiment may include a housing 160 including a front plate 1001a facing a first direction 1000a, a rear plate 1001b facing a second direction 1000b opposite to the first direction, and a side surface member (or side member) 1001c that surrounds at least part of an inner space between the front plate and the rear plate, in which the side surface member includes a first portion including a button hole 169 formed through the first portion toward the inner space from the outside of the side surface member in a third direction substantially perpendicular to the first direction, a display 150 exposed through at least a portion of the front plate, a mid-plate 1001d that is disposed between the front plate and the rear plate and that directly or indirectly supports the display, a button assembly 200 disposed in the opening and including a fingerprint sensor 212, in which at least part of the button assembly is exposed outside the side surface member, a waterproof bracket 290 that forms a space surrounding the button assembly, together with a portion of the mid-plate and the first portion of the side surface member, a first sealing member 291a disposed between the portion of the mid-plate and a first portion of the structure, and a second sealing member 291b disposed between the first portion of the side surface member and a second portion of the structure, in which the second sealing member is disposed closer to the rear plate than the first sealing member.

According to various embodiments, the first sealing member may be disposed between a surface of the portion of the mid-plate that faces the second direction and a surface of the structure that faces the first direction.

According to various embodiments, the second sealing member may be disposed between a surface of the first portion that faces the third direction and a surface of the structure that faces a fourth direction opposite to the third direction.

According to various embodiments, the electronic device may further include a printed circuit board disposed between the mid-plate and the rear plate.

According to various embodiments, the electronic device may further include a flexible printed circuit board that extends from the fingerprint sensor through between the portion of the mid-plate and the first portion of the structure and that is electrically connected to the printed circuit board.

Figure 11A:
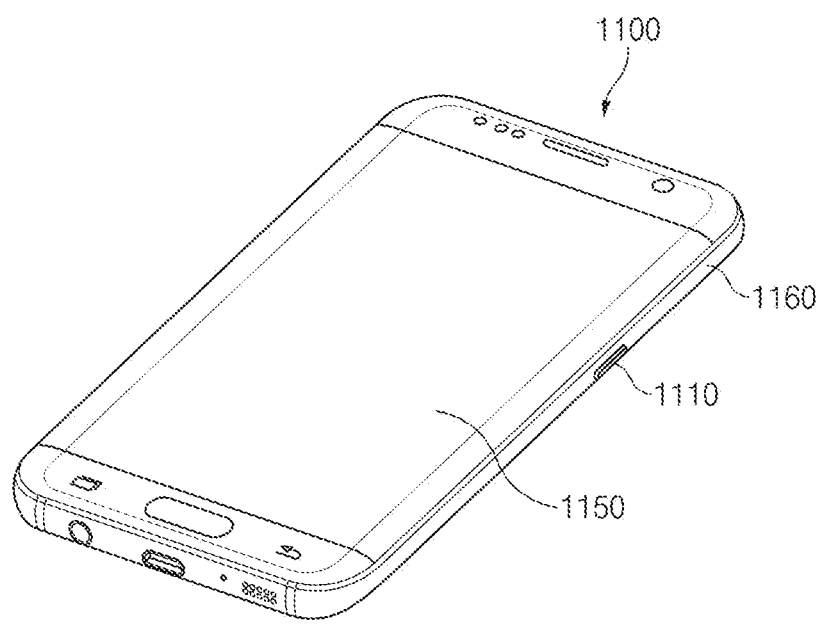
FIG. 11A is a view illustrating a front side of an electronic device according to various embodiments.
Figure 11B:
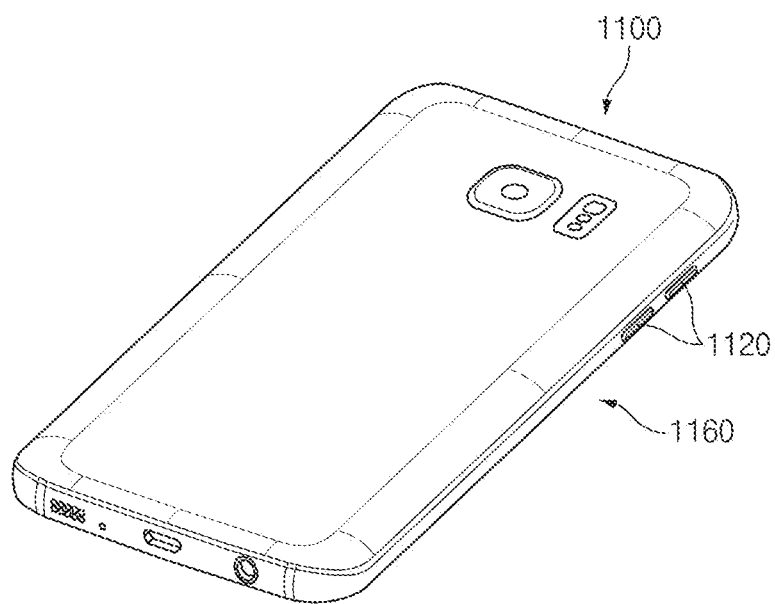
FIG. 11B is a view illustrating a rear side of the electronic device according to various embodiments.

FIG. 11A is a view illustrating a front side of an electronic device according to various embodiments, and FIG. 11B is a view illustrating a rear side of the electronic device according to various embodiments.

Referring to FIGS. 11A and 11B, in an electronic device 1100 according to an embodiment, a display 1150 may be disposed on one housing 1160, and one or more physical button structures 1110 and 1120 may be disposed on a sidewall of the housing 1160. The physical button structures 1110 and 1120 may include the physical button module, the support bracket, and the waterproof bracket that have been described above with reference to FIGS. 1 to 10, and may support a waterproof or dustproof function.

According to the various embodiments described above, an electronic device according to an embodiment may include a housing, a button hole disposed on a side of the housing, a physical button mounted in the button hole, a support bracket that supports the physical button, and a waterproof bracket that seals, on a side of the housing to which the button hole is adjacent, at least part of a specified area where the physical button and the support bracket are disposed. The waterproof bracket includes a first bracket that makes close contact inside the housing (or that contacts with at least portion of inside part of the housing) in a direction toward a first surface of the housing and a second bracket that extends from the first bracket while forming a predetermined angle with the first bracket and that makes close contact inside the housing in a direction toward a second surface of the housing that is different from the first surface of the housing.

According to various embodiments, the electronic device may further include an adhesive member disposed between the first bracket and the first surface of the housing and between the second bracket and the second surface of the housing.

According to various embodiments, the adhesive member may be arranged along at least an edge of the waterproof bracket to form a closed curve.

According to various embodiments, the physical button may include a contact portion mounted in the button hole, in which at least part of the contact portion is exposed to the outside, a support portion connected to the contact portion and mounted inside the housing to prevent the contact portion from being separated out of the button hole, and a dome key disposed on a side of the support portion.

According to various embodiments, the electronic device may further include a support member that is disposed behind the dome key and that disperses pressure applied to the dome key.

According to various embodiments, the support bracket may be disposed to be brought into contact with the support member.

According to various embodiments, the electronic device may further include a sensor and a sensor substrate disposed in at least one of the contact portion and the support portion, wiring electrically connected with the sensor substrate, and sensor circuitry electrically connected with the wiring.

According to various embodiments, the sensor circuitry may be disposed outside an area sealed by the waterproof bracket inside the housing.

According to various embodiments, the housing may include a bottom groove in which part of the wiring is disposed, the bottom groove being concavely formed in a lower position than a surrounding area, a first waterproof tape that is disposed on the bottom of the bottom groove and that fixes the wiring, and a second waterproof tape disposed on the wiring placed on the first waterproof tape.

According to various embodiments, the electronic device may further include an adhesive member disposed between the waterproof bracket and the second waterproof tape.

According to various embodiments, the waterproof bracket may further include a bracket support that is disposed on rear surfaces of the first bracket and the second bracket and that supports the support bracket.

According to various embodiments, the bracket support may include a wiring groove in which the wiring is placed.

According to various embodiments, the bracket support may include a first bracket support placed on the rear surfaces of the first bracket and the second bracket and a second bracket support further protruding beyond a surface of the first bracket support, in which at least part of the second bracket support faces the support bracket.

According to various embodiments, the dome key may be disposed on a rear surface of the sensor substrate.

According to various embodiments, the wiring may be electrically connected with the sensor substrate through the dome key.

According to various embodiments, the wiring may transfer, to the sensor circuitry, at least one of a dome key contact signal according to a push of the physical button and a sensor signal according to operation of the sensor.

According to various embodiments, the electronic device may further include at least one of a printed circuit board electrically connected with the sensor circuitry and a display disposed on a side of the housing.

According to various embodiments, the housing may include a first housing that supports one area of the display, a second housing that supports the remaining area of the display, and a hinge housing that supports a hinge operation of the first housing and the second housing.

According to various embodiments, the display may include a flexible display, at least part of a central portion of which is folded at a specified angle or more.

According to various embodiments, rear surfaces of the first bracket and the second bracket may be formed to have a predetermined curvature.

As described above, the various embodiments employ a more stable waterproof structure in the housing area where the physical button structure is disposed, thereby preventing fluid from being introduced into the electronic device.

In addition, the disclosure may provide various effects that are directly or indirectly recognized.

The above-described embodiments of the disclosure are provided merely to easily describe technical details of the disclosure and to help the understanding of the disclosure, and are not intended to limit the scope of the disclosure. Therefore, it should be construed that all modifications and changes or various other embodiments based on the technical idea of the disclosure fall within the scope of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

Although the present disclosure has been described with various embodiments, various changes and modifications may be suggested to one skilled in the art. It is intended that the present disclosure encompass such changes and modifications as fall within the scope of the appended claims

What is claimed is:

1. An electronic device comprising:
    a housing including:
        a front plate facing a first direction,
        a rear plate facing a second direction opposite to the first direction, and
        a side surface member configured to surround at least part of an inner space between the front plate and the rear plate, wherein the side surface member includes a first portion including an opening formed through the first portion toward the inner space from an outside of the side surface member in a third direction substantially perpendicular to the first direction;
    a display exposed through at least a portion of the front plate;
    a mid-plate disposed between the front plate and the rear plate and configured to directly or indirectly support the display;
    a button assembly disposed in the opening and including a fingerprint sensor, wherein at least part of the button assembly is exposed outside the side surface member;
    a structure configured to form a space surrounding the button assembly, together with a portion of the mid-plate and the first portion of the side surface member;
    a first sealing member disposed between the portion of the mid-plate and a first portion of the structure and the first sealing member is disposed in the first direction toward the front plate; and
    a second sealing member disposed between the first portion of the side surface member and a second portion of the structure, wherein the second sealing member is disposed closer to the rear plate than the first sealing member and the second sealing member is disposed in the third direction toward the side surface member, wherein the first sealing member and the second sealing member are a single unit.

2. The electronic device of claim 1, wherein:
    the first sealing member is disposed between a surface of the portion of the mid-plate that faces the second direction and a surface of the structure that faces the first direction, and
    the second sealing member is disposed between a surface of the first portion of the side surface member that faces the third direction and a surface of the structure that faces a fourth direction opposite to the third direction.

3. The electronic device of claim 1, further comprising:
    a printed circuit board disposed between the mid-plate and the rear plate.

4. The electronic device of claim 3, further comprising:
a flexible printed circuit board extending from the fingerprint sensor through between the portion of the midplate and the first portion of the structure and electrically connected to the printed circuit board.

5. An electronic device comprising:
a housing;
a button hole formed on a side of the housing;
a physical button mounted in the button hole;
a support bracket configured to support the physical button; and
a waterproof bracket configured to seal, on a side of the housing adjacent to the button hole, at least part of a specified area where the physical button and the support bracket are disposed,
wherein the waterproof bracket is a single unit that includes:
a first bracket configured to contact with at least a first portion of an inside part of the housing, the first portion is opposite to a first exterior surface of the housing; and
a second bracket extending from the first bracket while forming a predetermined angle with the first bracket, the second bracket being configured to contact with at least a second portion of the inside part of the housing, the second portion is opposite to a second exterior surface of the housing that is different from the first exterior surface of the housing.

6. The electronic device of claim 5, further comprising:
an adhesive member disposed between the first bracket and the first portion of the housing and between the second bracket and the second portion of the housing.

7. The electronic device of claim 6, wherein the adhesive member is arranged along at least an edge of the waterproof bracket to form a closed curve.

8. The electronic device of claim 5, wherein the physical button includes:
a contact portion mounted in the button hole, wherein at least part of the contact portion is exposed to an outside of the button hole;
a support portion connected to the contact portion and mounted inside the housing to prevent the contact portion from being separated out of the button hole; and
a dome key disposed on a side of the support portion.

9. The electronic device of claim 8, further comprising:
a support member disposed behind the dome key and configured to disperse pressure applied to the dome key,
wherein the support bracket is disposed to be brought into contact with the support member.

10. The electronic device of claim 8, further comprising:
a sensor and a sensor substrate disposed in at least one of the contact portion and the support portion;
wiring electrically connected with the sensor substrate; and
sensor circuitry electrically connected with the wiring,
wherein the sensor circuitry is disposed outside an area sealed by the waterproof bracket inside the housing.

11. The electronic device of claim 10, wherein the housing includes:
a bottom groove in which part of the wiring is disposed, the bottom groove being concavely formed in a lower position than a surrounding area;
a first waterproof tape disposed on a bottom of the bottom groove and configured to fix the wiring; and
a second waterproof tape disposed on the wiring placed on the first waterproof tape.

12. The electronic device of claim 11, further comprising:
an adhesive member disposed between the waterproof bracket and the second waterproof tape.

13. The electronic device of claim 10, wherein the waterproof bracket further includes:
a bracket support disposed on rear surfaces of the first bracket and the second bracket and configured to support the support bracket.

14. The electronic device of claim 13, wherein the bracket support includes:
a wiring groove in which the wiring is placed.

15. The electronic device of claim 13, wherein the bracket support includes:
a first bracket support placed on the rear surfaces of the first bracket and the second bracket; and
a second bracket support further protruding beyond a surface of the first bracket support, wherein at least part of the second bracket support faces the support bracket.

16. The electronic device of claim 10, wherein the dome key is disposed on a rear surface of the sensor substrate, and
wherein the wiring is electrically connected with the sensor substrate through the dome key.

17. The electronic device of claim 16, wherein the wiring transfers at least one of a dome key contact signal according to a push of the physical button or a sensor signal according to operation of the sensor to the sensor circuitry.

18. The electronic device of claim 10, wherein:
the electronic device further comprises at least one of a printed circuit board electrically connected with the sensor circuitry and a display disposed on a side of the housing, and
the housing includes:
a first housing configured to support one area of the display;
a second housing configured to support a remaining area of the display; and
a hinge housing configured to support a hinge operation of the first housing and the second housing.

19. The electronic device of claim 18, wherein the display includes a flexible display, at least part of a central portion of which is folded at a specified angle or more.

20. The electronic device of claim 5, wherein rear surfaces of the first bracket and the second bracket are formed to have a predetermined curvature.

\* \* \* \* \*